(12) United States Patent
Huang et al.

(10) Patent No.: US 11,961,946 B2
(45) Date of Patent: Apr. 16, 2024

(54) ELECTRONIC DEVICES WITH FLEXIBLE DISPLAYS

(71) Applicant: Apple Inc., Cupertino, CA (US)

(72) Inventors: Chang-Chia Huang, San Jose, CA (US); Hoon Sik Kim, Los Gatos, CA (US); Paul S. Drzaic, Morgan Hill, CA (US); Terry C. Lam, Mountain View, CA (US); Yasmin F. Afsar, San Jose, CA (US); Zhichun Shao, Albany, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/390,504

(22) Filed: Jul. 30, 2021

(65) Prior Publication Data

US 2022/0077352 A1     Mar. 10, 2022

Related U.S. Application Data

(60) Provisional application No. 63/076,835, filed on Sep. 10, 2020.

(51) Int. Cl.
*H01L 33/48* (2010.01)
*H05K 1/02* (2006.01)

(52) U.S. Cl.
CPC .......... *H01L 33/483* (2013.01); *H05K 1/028* (2013.01); *H05K 2201/10272* (2013.01)

(58) Field of Classification Search
CPC ....... H01L 33/48; H01L 33/483; H05K 1/028; H05K 2201/10272

USPC .......................................................... 361/749
See application file for complete search history.

(56) References Cited

U.S. PATENT DOCUMENTS

| | | | |
|---|---|---|---|
| 8,908,365 | B2 | 12/2014 | Walters et al. |
| 9,504,170 | B2 | 11/2016 | Rothkopf et al. |
| 9,910,458 | B2 | 3/2018 | Watanabe et al. |
| 10,509,441 | B2 | 12/2019 | Wu et al. |
| 2018/0146560 | A1 | 5/2018 | Chen et al. |
| 2018/0232011 | A1 | 8/2018 | Jiang et al. |
| 2019/0373743 | A1 | 12/2019 | Liu et al. |
| 2021/0018962 | A1 | 1/2021 | de la Fuente |

(Continued)

FOREIGN PATENT DOCUMENTS

| | | |
|---|---|---|
| CN | 210629557 U | 5/2020 |
| EP | 2728434 B1 | 7/2017 |

*Primary Examiner* — Tremesha S Willis
(74) *Attorney, Agent, or Firm* — Treyz Law Group, P.C.; G. Victor Treyz; Tianyi He

(57) ABSTRACT

A foldable electronic device may have a foldable housing. The foldable housing may be configured to bend about a bend axis. First and second portions of the housing that rotate relative to each other may be coupled by a hinge that is aligned with the bend axis. A foldable display may be coupled to the foldable housing and may be configured to bend along the bend axis as the foldable housing is folded. The display may have an array of pixels supported by a metal layer. The pixels may be interposed between a display cover layer and the metal layer. The foldable housing may have a support layer. To help support the display for bending about the bend axis while preventing damage to the display when the display is contacted by an external object, a spring layer may be interposed between the metal layer and the support layer.

22 Claims, 12 Drawing Sheets

(56) References Cited

U.S. PATENT DOCUMENTS

2022/0355465 A1\* 11/2022 Koda ................ B25J 5/00
2023/0099802 A1\* 3/2023 An ................ H04M 1/0268
                                                    455/566

\* cited by examiner

ELECTRONIC DEVICES WITH FLEXIBLE DISPLAYS

This application claims the benefit of U.S. provisional patent application No. 63/076,835, filed Sep. 10, 2020, which is hereby incorporated by reference herein in its entirety.

FIELD

This relates generally to electronic devices, and, more particularly, to electronic devices with displays.

BACKGROUND

Electronic devices often have displays. Portability is often a concern for electronic devices, which tends to limit available real estate for displays.

SUMMARY

A foldable electronic device may have a foldable housing. The foldable housing may be configured to bend about a bend axis. First and second portions of the housing that rotate relative to each other may be coupled by a hinge that is aligned with the bend axis. A foldable display may be coupled to the foldable housing and may be configured to bend along the bend axis as the foldable housing is folded. The device may be placed in a closed configuration in which the display is folded for storage and an open configuration in which the display is unfolded and available for displaying images for a user.

The foldable display may have an array of pixels supported by a metal layer. The pixels may be interposed between a display cover layer and the metal layer. The foldable housing may have a rear housing wall or other support layer. To help support the display for bending about the bend axis while preventing damage to the display when the display is contacted by an external object, a spring layer may be interposed between the metal layer and the support layer.

The spring layer may be formed from an array of springs. The springs may be formed from metal. Different springs may be formed in different areas. For example, a strip-shaped area aligned with the bend axis may have softer springs than other areas.

Sensors may be included in the spring layer. The sensors may be formed from force sensing structures such as strain gauges and may be supported on portions the springs or may be located adjacent to the springs. If desired, foam posts and other compressible structures may be interspersed with the springs to help adjust the performance of the spring layer.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., diodes formed from crystalline semiconductor dies).

Figure 1:
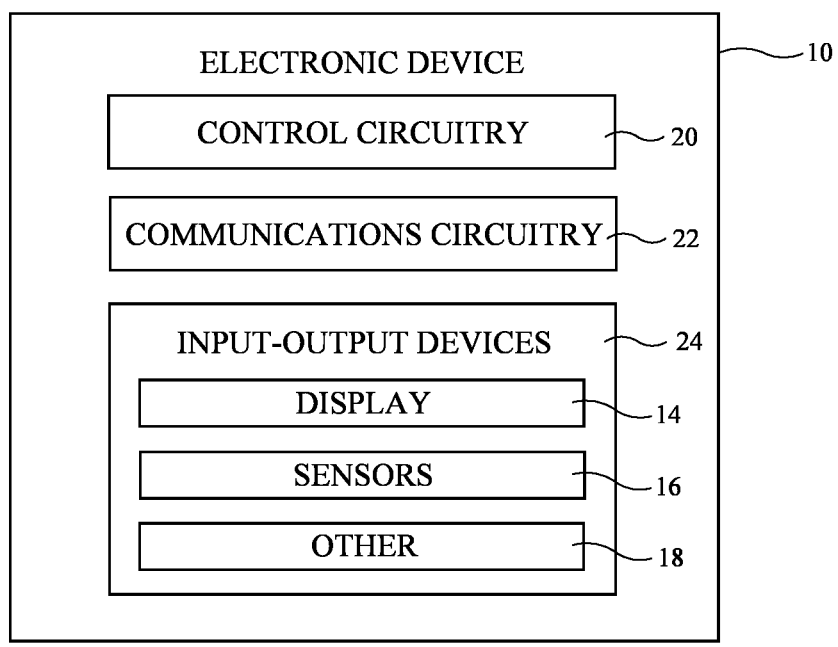
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a wristwatch, cellular telephone, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed as part of a display panel that is bendable. This allows device 10 to be folded and unfolded about a bend axis. For example, a flexible (bendable) display in device 10 may be folded so that device 10 may be placed in a compact shape for storage and may be unfolded when it is desired to view images on the display.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
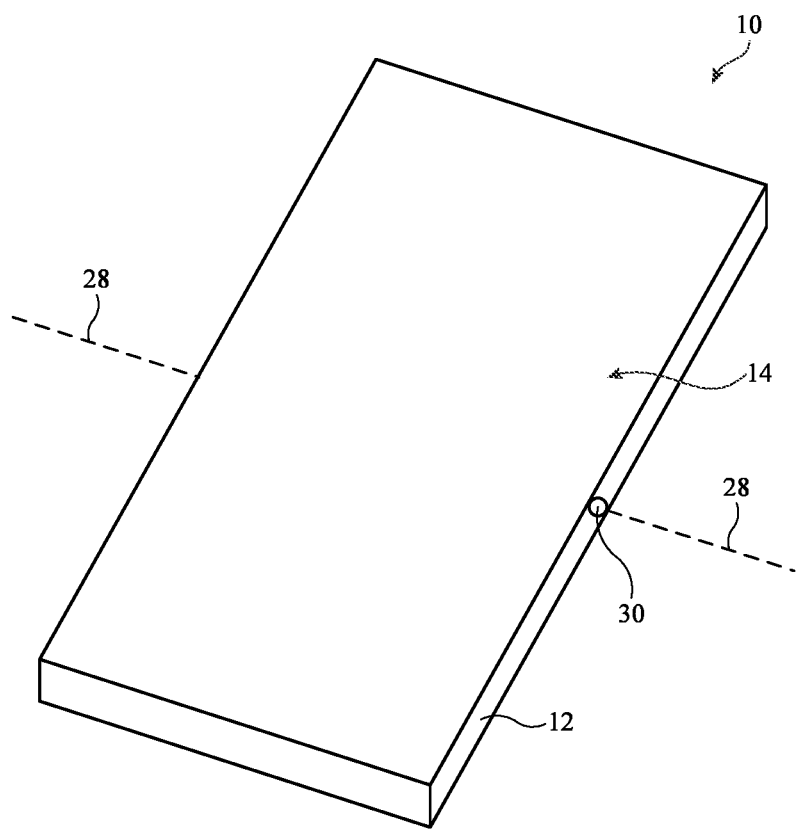
FIG. 2 is a perspective view of an illustrative electronic device with a display in accordance with an embodiment.

FIG. 2 is a perspective view of electronic device 10 in an illustrative configuration in which device 10 is a portable electronic device such as a cellular telephone or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14.

Display 14 may be mounted in housing 12. Housing 12 may form front and rear housing walls, sidewall structures, and/or internal supporting structures (e.g., a frame, midplate member, etc.) for device 10. Glass structures, transparent polymer structures, and/or other transparent structures that cover display 14 and other portions of device 10 may provide structural support for device 10 and may sometimes be referred to as housing structures or display cover layer structures. For example, a transparent housing portion such as a glass or polymer housing structure that covers and protects a pixel array in display 14 may serve as a display cover layer for the pixel array while also serving as a housing wall on the front face of device 10. The portions of housing 12 on the sidewalls and rear wall of device 10 may be formed from transparent structures and/or opaque structures.

Housing 12 may have flexible structures (e.g., bendable housing walls structures) and/or hinge structures such as hinge 30. Hinge 30 may have a hinge axis aligned with device bend axis 28. Hinge 30 and/or flexible housing structures that overlap bend axis 28 may allow housing 12 to bend about bend axis 28. For example, housing 12 may have a first portion on one side of bend axis 28 and a second portion on an opposing side of bend axis 28 and these two housing portions may be coupled by hinge 30 for rotational motion about axis 28.

As housing 12 is bent about bend axis 28, the flexibility of display 14 allows display 14 to bend about axis 28. In an illustrative configuration, housing 12 and display 14 may bend by 180°. This allows display 14 to be folded back on itself (with first and second outwardly-facing portions of display 14 facing each other). The ability to place device 10 in a folded configuration in this way may help make device 10 compact so that device 10 can be stored efficiently. When it is desired to view images on display 14, device 10 may be unfolded about axis 28 to place device 10 in the unfolded configuration of FIG. 2. This allows display 14 to lie flat and allows a user to view flat images on display 14. The ability to fold display 14 onto itself allows device 10 to exhibit an inwardly folding behavior. Display 14 may be sufficiently flexible to allow device 10 to be folded outwardly and/or inwardly.

Device 10 of FIG. 2 has a rectangular outline (rectangular periphery) with four corners. As shown in FIG. 2, a first pair of parallel edges (e.g., the left and right edges of device 10 in the example of FIG. 2) may be longer than a second pair of parallel edges (e.g., the upper and lower edges of device 10 of FIG. 2) that are oriented at right angles to the first pair of parallel edges. In this type of configuration, housing 12 is elongated along a longitudinal axis. Housing 12 may have other shapes, if desired. With an arrangement of the type shown in FIG. 2, the length of device 10 along its longitudinal axis may be reduced by folding device 10 about axis 28.

Figure 3:
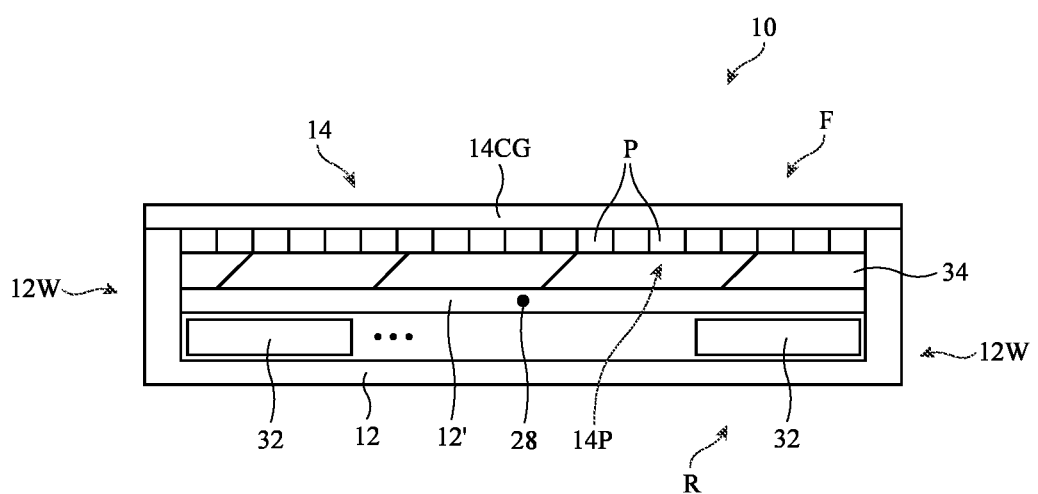
FIG. 3 is a cross-sectional side view of an illustrative electronic device in accordance with an embodiment.

FIG. 3 is a cross-sectional side view of an illustrative foldable electronic device. Device 10 of FIG. 3 may bend about bend axis 28. Display 14 includes an array of pixels P forming display panel 14P under an inwardly facing surface of display cover layer 14CG. Display panel 14P may be, for example, a flexible organic light-emitting diode display or a microLED display in which light-emitting pixels are formed on a flexible substrate layer (e.g., a flexible layer of polyimide or a sheet of other flexible polymer). Flexible support layer(s) for display 14 may also be formed from flexible glass, flexible metal, and/or other flexible structures. Display cover layer 14CG may be formed from polymer, glass, crystalline materials such as sapphire, other materials, and/or combinations of these materials. The thickness of layer 14CG may be 100-200 microns, less than 250 microns, less than 150 microns, less than 100 microns, at least 50 microns, or other suitable thickness.

In the example of FIG. 3, housing 12 has a portion on rear face R that forms a rear housing wall and has side portions forming sidewalls 12W. The rear housing wall of housing 12 may form a support layer for components in device 10. Housing 12 may also have one or more interior supporting layers (e.g., frame structures) such as illustrative housing midplate 12'. Midplate 12' may be formed from a layer of metal. Midplate 12' may have first and second portions that are coupled to opposing sides of a hinge that is aligned with bend axis 28 (see, e.g., hinge 30 of FIG. 2) or midplate 12' may be sufficiently flexible to allow bending of midplate 12' around bend axis 28.

Electrical components 32 may be mounted in the interior of device 10 (e.g., between display 14 and the rear of housing 12, between midplate 12' and the opposing rear housing wall formed by housing 12 on rear face R, etc.). Components 32 may include circuitry of the type shown in FIG. 1 (e.g., control circuitry 20, communications circuitry 22, input-output devices 24, batteries, etc.). If desired, some or all of midplate 12' may be omitted and/or additional internal support structures may be provided to strengthen device 10.

Display 14 may be mounted on front face F of device 10. When device 10 is folded about axis 28, display cover layer 14CG, display panel 14P, and the other structures of device 10 that overlap bend axis 28 may flex and bend to accommodate folding. To relieve stresses that might otherwise tend to build up as the layers of display 14 are bent about axis 28 and/or as display 14 is subjected to a localized force from an external object during an impact event, device 10 may include spring layer 34. Spring layer 34 may have spring structures that tend to dissipate applied force over a relatively large fraction of the area of front face F and thereby help display panel 14P to deflect smoothly over a relatively large area when subjected to stress from bending about axis 28 or impact stress that arises when an external object bears against a particular location on the surface of display 14. The ability of spring layer 34 to deflect smoothly in this way helps prevent excessive localized deformation that could lead to concentrated stress and damage to the thin-film circuitry and/or other components of display panel 14P. The spring structures may, as an example, include springs that are formed from flexible metal (e.g., spring metal such as spring steel, nickel-chromium aluminum alloys, beryllium copper alloys, stainless steel, cobalt-nickel alloys, etc.).

Figure 4:
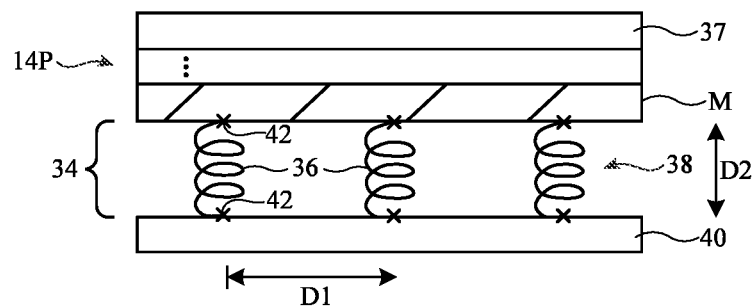
FIG. 4 is a cross-sectional side view of an illustrative display supported by springs in accordance with an embodiment.

FIG. 4 is a side view of device 10 showing how display panel 14P may include a stack of layers 37. Layers 37 may include polarizer layers, thin-film encapsulation layers, thin-film circuitry including pixel circuits for the pixels of panel 14P, light-emitting diodes for the pixels of panel 14P, and/or other display circuitry, flexible substrate layer(s), etc. Spring layer 34 may be interposed between display panel 14P and support layer 40. Layer 40 may be formed from a housing structure such as midplate 12', a rear housing wall in housing 12, and/or other support layer in device 10.

A metal layer such as layer M may be formed as the lowermost layer of panel 14P and/or a metal layer such as metal layer M may be formed from a separate layer that is attached to panel 14P by a layer of adhesive. Spring layer 34 may be formed from an array of springs 36. Springs 36 may be formed in a gap between layer M and layer 40 (e.g., an air-filled gap or a gap filled with liquid, gel, or other such material). Attachment structures 42 (e.g., welds, adhesive, solder, screws and/or other fasteners, engagement structures such as clips and snaps, press-fit connections, and/or other attachment mechanisms) may be used to attach springs 36 to layer M and/or layer 40). The size of gap 38 (e.g., distance D2 between layer M and layer 40, which is equal to the thickness of springs 36) may be 0.5 mm, 1.3 mm, 1.5 mm, 0.2-3 mm, at least 0.2 mm, at least 0.4 mm, at least 0.7 mm, at least 1 mm, at least 2 mm, less than 10 mm, less than 3 mm, less than 2.5 mm, less than 1.5 mm, less than 1 mm, or other suitable size. In an illustrative configuration, sufficient compression and support may be provided by springs of 0.5 mm in thickness. The pitch (center-to-center spacing DO of springs 36 may be 3 mm, 8 mm, 10 mm, 17 mm, at least 0.5 mm, 1-30 mm, at least 1 mm, at least 2 mm, at least 3 mm, at least 5 mm, at least 10 mm, at least 15 mm, at least 25 mm, less than 100 mm, less than 30 mm, less than 20 mm, less than 10 mm, less than 5 mm, less than 3 mm, less than 2 mm or other suitable value. To provide uniform support for display 14, it may be desirable for the pitch of springs 36 to be less than 3 mm (as an example).

Figure 5:
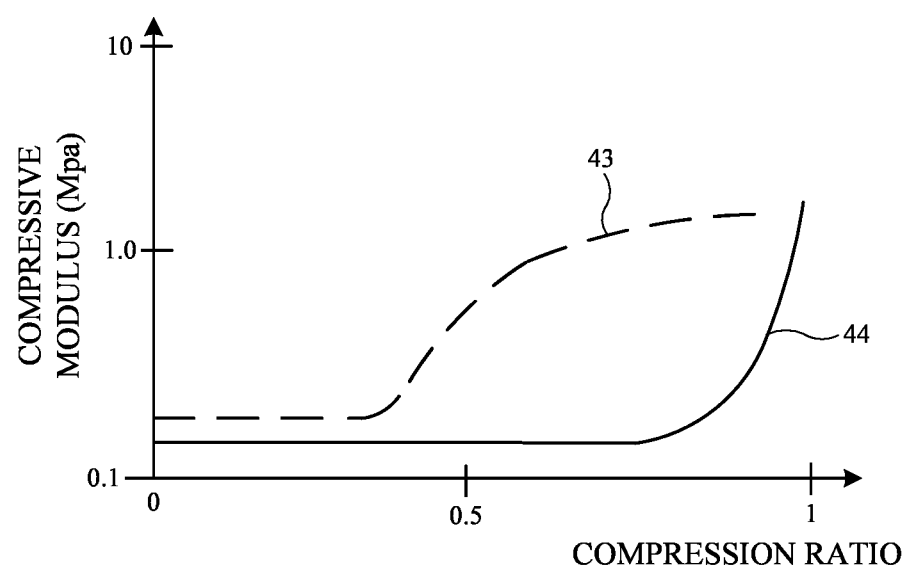
FIG. 5 is a graph in which compression modulus has been plotted as a function of compression ratio for different types of flexible display support systems in accordance with an embodiment.

FIG. 5 is a graph in which compression modulus as a function of compression ratio is compared for illustrative display systems with and without spring layer 34. Curve 43 corresponds to an illustrative display in which spring layer 34 has been replaced with a layer of compressible foam. Curve 44 corresponds to an illustrative display that is supported on spring layer 34. When an external force is applied (e.g., localized downward force at a location on the surface of display 14), display 14 is pressed inwardly and compresses the underlying support structures in device 10. As shown by comparing curves 43 and 44, for a given amount of compression (compression ratio) for the display support layer, more strain energy is absorbed by the support layer when the support layer is formed by foam (curve 43) than with spring layer 34 (curve 44). This illustrates that the use of spring layer 34 in supporting at least some of display 14 in device 10 can help reduce the strain energy absorbed during an impact. Spring layer 34 helps redistribute stress by smoothing local deflection (e.g., by converting what would have been a deep localized depression from the impact into a larger-area shallow depression). If desired, spring layer 34 may include foam structures, springs of different heights, and/or other structures in addition to or instead of an array of springs 36 of the type shown in FIG. 4.

Figure 6:
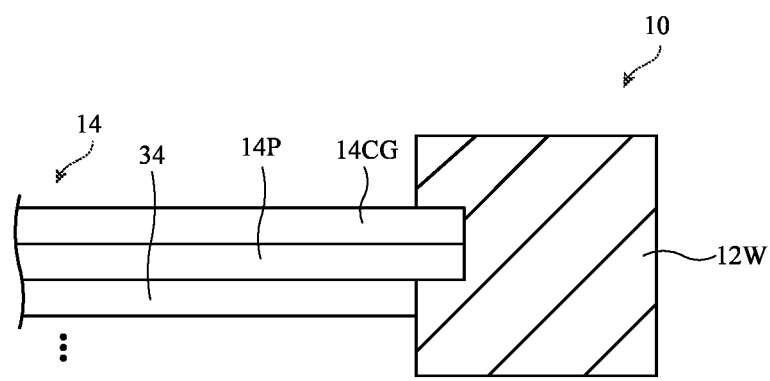
FIGS. 6 and 7 are cross-sectional side views of illustrative electronic device display system mounting arrangements in accordance with embodiments.
Figure 7:
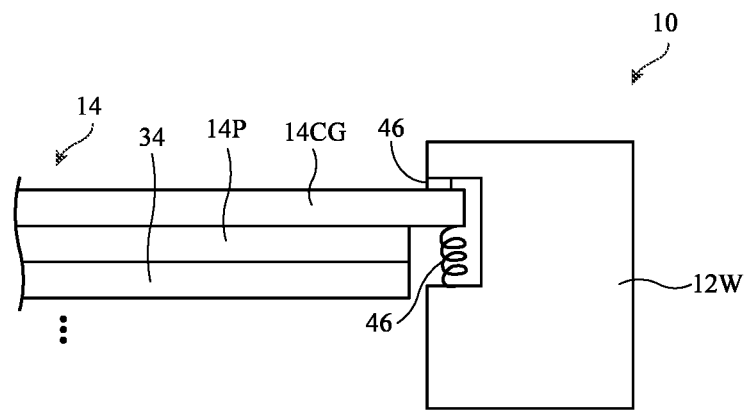

FIGS. 6 and 7 show how display 14 may be coupled to housing 12. In the example of FIG. 6, which may sometimes be referred to as a fully constrained display mounting system, display cover layer 14CG and display panel (display module) 14P have been captured within an inwardly facing groove in housing sidewall 12W, thereby helping these layers to resist vertical and horizontal movement within device 10 relative to housing 12. In the example of FIG. 7, which may sometimes be referred to as a partially constrained display mounting system, foam, springs, or other compressible structures such as structures 46 have been placed above and below display cover layer 14CG in the groove in sidewall 12W. The outermost edge of display cover layer 14CG is also recessed relative to sidewall 12W. This arrangement allows display 14 to move somewhat relative to housing 12 and may help reduce impact strain for impacts close to the edge of display 14.

Figure 8:
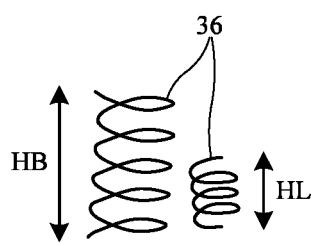
FIGS. 8, 9, 10, and 11 are side views of different illustrative spring-based systems for supporting flexible displays in accordance with embodiments.
Figure 9:
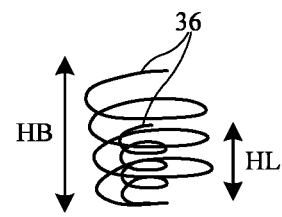
Figure 10:
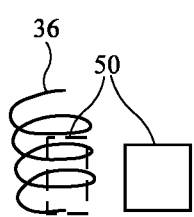
Figure 11:
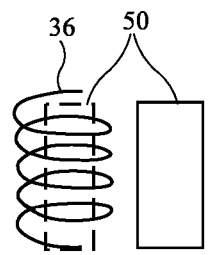

FIGS. 8-11 are side views of illustrative spring arrangements for use in the array of springs 36 in spring layer 34. As shown in FIG. 8, multiple different types of spring 36 may be used (e.g., springs with different stiffnesses, springs with different heights, springs with different diameters, springs of different shapes, sizes, and/or materials, etc.). A first set of springs 36 in layer 34 may, as an example, have a larger height HB and a second set of springs 36 may have a smaller height HL. In this type of configuration, the shorter springs are only activated when an impact produces a relatively large amount of inward force on display 14 (e.g., the shorter springs serve to provide additional spring power to handle impacts of large magnitudes). In the example of FIG. 8, springs of different types are located adjacent to each other. FIG. 9 shows how springs of different types (e.g., springs of different heights) may be mounted in a coaxial arrangement. FIG. 10 shows how a block of polymer foam or other non-spring compressible structure (see, e.g., foam posts 50) may be mounted coaxially with springs 36 or may be mounted adjacent to springs 36. In the FIG. 10 arrangement, foam structures such as foam posts 50 are shorter than spring 36 and thereby serve to provide additional support for display 14 and additional energy dissipation that helps display 14 recover when subjected to impacts with large amounts of force. If desired, posts 50 or other foam structures may have the same height as springs 36 (see, e.g., FIG. 11).

Figure 12:
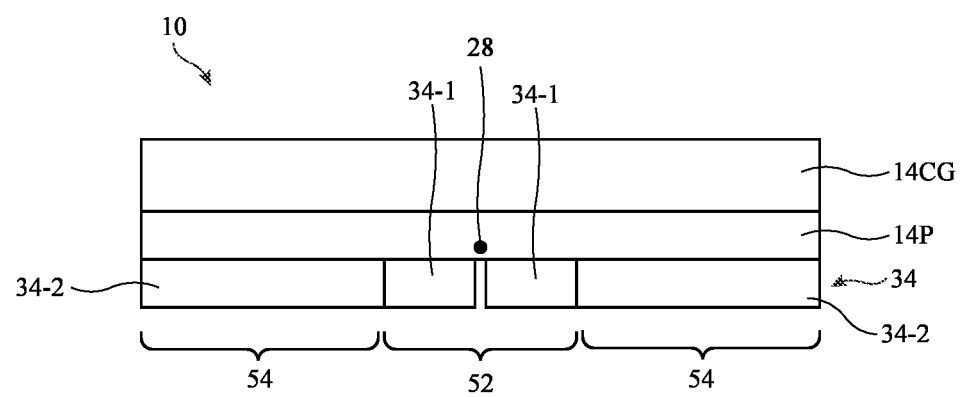
FIG. 12 is a cross-sectional side view of a display in accordance with an embodiment.

Springs 36 and/or other compressible structures such as foam structures may be distributed evenly across display 14 or may have different characteristics in different areas of display 14. As shown in the cross-sectional side view of device 10 in FIG. 12, for example, layer 34 may have a first portion 34-1 in an area such as strip 52 that overlaps and runs along bend axis 28 and may have a second portion 34-2 in other areas 54. Because portion 34-1 is adjacent to bend axis 28, portion 34-1 may be subjected to more deflection than portions 34-2 as device 10 bends while being opened and closed. Accordingly, it may be desirable to form portion 34-1 from softer springs or springs that otherwise differ from the springs of portion 34-2. In general, any suitable characteristics of portions 34-1 and 34-2 may differ from each other (e.g., spring shape, spring size, spring stiffness, spring pitch, foam type, foam shape and/or size, etc.).

Springs 36 may have spiral shapes, dome shapes, shapes based on spring arms, corrugated shapes, or other suitable shapes and may be formed individually and/or partly or completely attached to and/or integrally formed from a sheet of spring metal. FIGS. 13, 14, 15, 16, and 17 are diagrams of illustrative springs 36.

Figure 13:
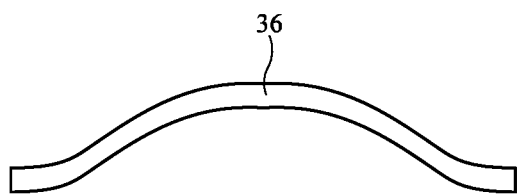
FIGS. 13, 14, 15, 16, 17, 18, 19, 20, 21, and 22 are views of illustrative springs in accordance with embodiments.
Figure 14:
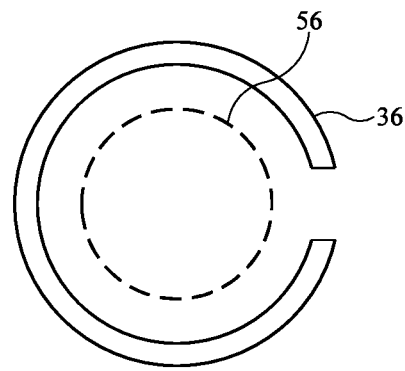

In the example of FIGS. 13 and 14, spring 36 is a washer spring. FIG. 13 is a side view of the washer spring showing how the washer spring may have portions of different heights at different locations around its periphery (e.g., the spring may have a wavy appearance when viewed from the side). FIG. 14 is a top view of the illustrative washer spring of FIG. 13 showing how the washer spring may have a ring shape with a circular footprint (outline when viewed from above).

If desired, a pressure sensor (sometimes referred to as a force sensor) such as pressure sensor 56 may be overlapped by spring 36 and aligned with spring 36 as shown in FIG. 14 (e.g., sensor 56 may be located in a central circular opening of a ring-shaped spring). Sensors such as sensors 56 may also be located between adjacent springs 36. Sensor 56 may be a capacitive force sensor, a piezoelectric force sensor, a resistive force sensor, a strain gauge, an optical sensor for measuring force, a sensor that measures displacement and/or movement in addition to or instead of measuring applied force, or any other suitable force sensor.

Figure 15:
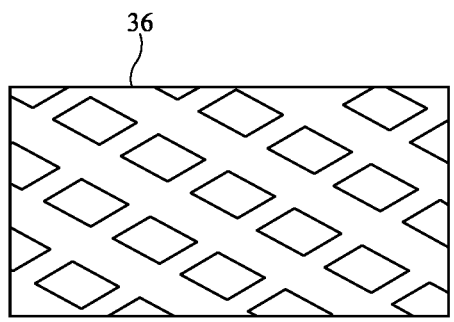

As shown in the side view of illustrative spring 36 of FIG. 15, spring 36 may have a hollow tubular shape (e.g., a hollow cylindrical shape). Spring 36 of FIG. 15, which may sometimes be referred to as a wave washer, may be formed from a hollow metal tube or other tube with flexibility-enhancement sidewall openings such as a series of diamond shaped openings or other perforations that provide spring 36 with axial flexibility (e.g., flexibility-enhancement sidewall openings).

Figure 16:
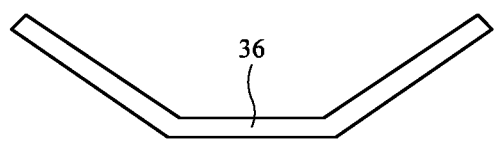
Figure 17:
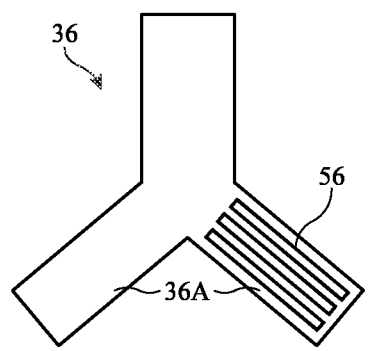

FIGS. 16 and 17 are diagrams of an illustrative spring with spring arms. The side view of spring 36 of FIG. 16 shows how the spring arms may extend upwardly from a central point. FIG. 17 shows how the arms may be distributed around the circumference of spring 36 (e.g., spring arms 36A may each be spaced apart from each other by 120°) and may extend radially outward from the center of the spring. There may be three arms 36A, four arms 36A, or other suitable number of arms 36A. The configuration of FIGS. 16 and 17 is illustrative. As shown in FIG. 17, a force sensors 56 may be formed on one or more of arms 36A. The force sensor(s) of FIG. 17 may be, for example, strain gauges formed from meandering metal traces on a dielectric layer on the surface of spring arm(s) 36A. There may be one or more sensors 56 for each spring 36 in layer 34 or layer 34 may have fewer sensors 56 (e.g., only a subset of springs 36 may have associated sensors for measuring applied force).

During operation of device 10, control circuitry 20 may gather information on the amount of applied force on display 14 using sensors 56. Circuitry 20 may, for example, monitor sensors 56 to determine whether excessive force is applied to one or more areas of display 14. If excessive force is detected, an alert may be generated (e.g., an audible or visible warning message), the amount of detected force may be logged in memory for future retrieval and analysis, and/or other suitable action may be taken. If desired, a user may press on display 14 to provide force input and the force sensors may be used to measure the force input. The force input may direct circuitry 20 to take action (e.g., force input may be used to select an on-screen item on display 14, etc.).

Additional illustrative spring shapes are shown in FIGS. 18, 19, 20, 21, and 22.

Figure 18:
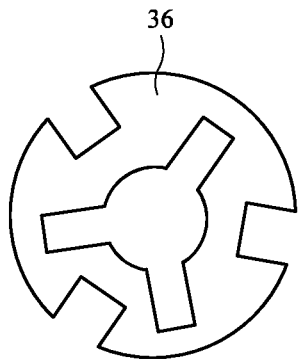

As shown in the top view of illustrative spring 36 of FIG. 18, spring 36 may have a circular outline with a central opening that has three radially extending slots. Spring 36 may have a wavy cross-sectional shape (e.g., spring 36 may form a washer spring), may have a dome shape, or may have other suitable spring shape that provides spring with a desired thickness.

Figure 19:
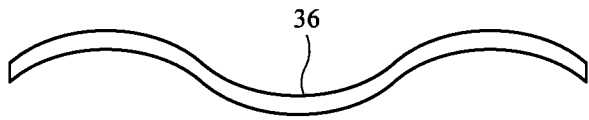

FIG. 19 is a cross-sectional side view of an illustrative 2D wave spring. FIG. 19 shows how springs 36 may be formed by corrugations in a layer of metal. The corrugated spring structure of FIG. 19 has alternating ridges and grooves. The ridges and grooves may extend parallel to each other across display 14 (e.g., into the page in the example of FIG. 19).

Figure 20:
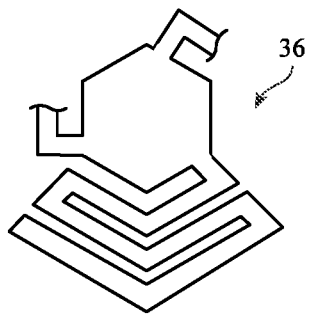

The top view of spring 36 of FIG. 20 shows how spring 36 may have a hexagon pyramid spring arrangement. As shown in FIG. 20, spring 36 may have a hexagonal central portion with radially extending and meandering spring arms. The arms extend out of the page of FIG. 20 to provide spring 36 with a desired thickness.

Figure 21:
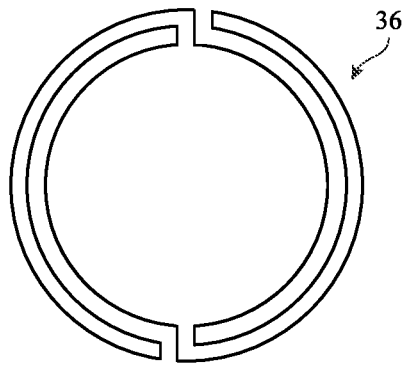

As shown by the top view of illustrative spring 36 of FIG. 21, spring 36 may have a circular patch surrounded by curved arms. In the example of FIG. 21, spring 36 has two arms, each of which runs along an opposing curved edge of the circular patch. If desired, this type of spring may have three or more curved arms. The arms of spring 36 of FIG. 21 are angled out of the page of FIG. 21 (e.g., at an angle of 5-30° or other suitable angle) so that spring 36 has a desired thickness.

Figure 22:
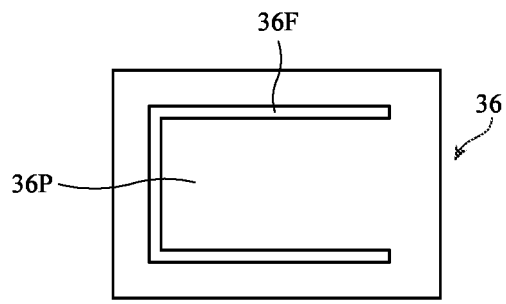

FIG. 22 is a top view of spring 36 in an illustrative cantilever spring configuration. Portion 36F of spring 36 may be flat and lie parallel to display 14. Arm 36P of spring 36 may be angled slightly out of the page of FIG. 22 to provide spring 36 with a desired thickness.

Figure 23:
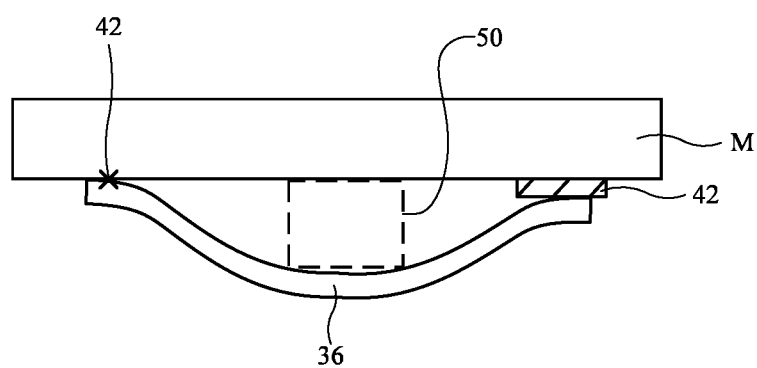
FIG. 23 is a cross-sectional side view of a spring coupled to a metal layer in accordance with an embodiment.

FIG. 23 is a cross-sectional side view of an illustrative spring coupled to metal layer M. As shown in FIG. 23, spring 36 may be coupled to layer M using attachment structures 42. Structures 42 may include, for example, a weld that attaches an arm or other portion of spring 36 to layer M at one location and adhesive that attaches one or more additional arms (or other portions) of spring 36 to layer M at one or more additional locations. The use of adhesive may provide the additional arms with the ability to move laterally under layer M when compressed. Optional foam post 50 may be used to help dissipate impact energy when display 14 is impacted by an external object. A force sensor (e.g., sensor 56) may, if desired, be formed on one of the surfaces of spring 36 and/or may be located adjacent to or under spring 36 to help measure applied force to spring layer 34.

Figure 24:
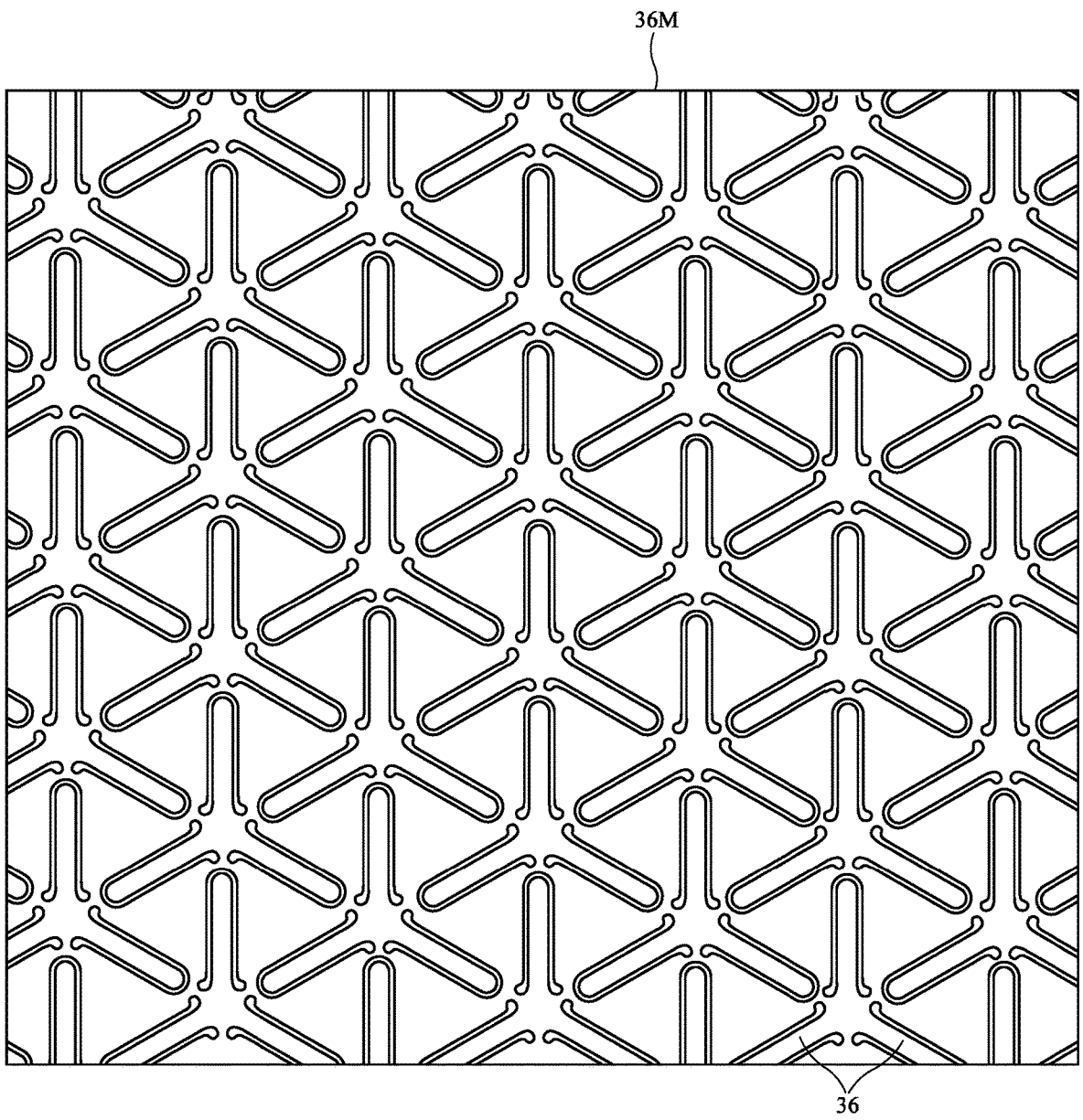
FIG. 24 is a top view of an array of illustrative springs formed from a sheet of metal in accordance with an embodiment.

As described in connection with FIGS. 13, 14, 15, 16, and 17, springs may be formed as stand-alone elements or may be formed as integral portions of a sheet of metal or other spring material. As an example, springs with sets of three radially extending spring arms such as springs 36 of FIGS. 16 and 17 may be formed in an array on a sheet of metal as shown by illustrative springs 36 in metal sheet 36M of FIG. 24. Each spring 36 of FIG. 24 has three radially extending arms. The arms are separated from each other by 120° and are attached at their bases to metal sheet 36M. Each spring arm is bent upwards at its tip (out of the plane of FIG. 24) to form spring 36, as shown in the cross-sectional side view of spring 36 of FIG. 16. Laser cutting, drilling, water jet cutting, stamping, and/or other fabrication techniques may be used to form sheets of springs 36 having the illustrative shapes of FIG. 24 and/or other suitable spring shapes (see, e.g., FIGS. 13, 14, 15, 16, and 17, etc.).

The foregoing is merely illustrative and various modifications can be made to the described embodiments. The foregoing embodiments may be implemented individually or in any combination.

What is claimed is:

1. An electronic device, comprising:
   a foldable housing that is configured to bend about a bend axis and that has a support layer;
   a flexible display panel separated from the support layer by a gap; and
   a spring layer between the support layer and the flexible display panel, wherein the spring layer comprises a spring having a first end attached to the support layer and a second end attached to the flexible display panel and extending across the gap.

2. The electronic device defined in claim 1 wherein the spring layer comprises an array of springs containing the spring.

3. The electronic device defined in claim 2 wherein the array of springs comprises springs selected from the group consisting of: spiral springs, dome springs, corrugated springs, springs formed from axially compressible cylindrical tubes with flexibility-enhancement sidewall openings, springs with arms, and cantilever springs.

4. The electronic device defined in claim 3 wherein the array of springs comprises metal springs.

5. The electronic device defined in claim 4 further comprising foam posts between the support layer and the flexible display panel.

6. The electronic device defined in claim 5 further comprising a force sensor configured to measure force applied to the flexible display panel.

7. The electronic device defined in claim 1 wherein the flexible display panel has a metal layer and wherein the spring is welded to the metal layer.

8. The electronic device defined in claim 1 wherein the flexible display panel has a metal layer and wherein the spring is attached to the metal layer with adhesive.

9. The electronic device defined in claim 1 wherein the spring layer comprises an additional spring of a first thickness that is different than a second thickness of the spring.

10. The electronic device defined in claim 1 wherein the flexible display panel comprises an array of light-emitting diodes, the electronic device further comprising a display cover layer that overlaps the array of light-emitting diodes.

11. The electronic device defined in claim 1 wherein the support layer comprises a metal midplate.

12. The electronic device defined in claim 1 further comprising a force sensor, wherein the spring comprises a metal spring and wherein the force sensor is on the metal spring.

13. The electronic device defined in claim 12 wherein the metal spring has at least one arm and wherein the force sensor comprises a strain gauge on the arm.

14. The electronic device defined in claim 1 wherein the foldable housing has a hinge aligned with the bend axis, wherein the spring layer comprises an array of springs containing the spring, and wherein the array of springs is characterized by a spring-center-to-spring-center pitch of less than 3 mm and a thickness of 0.2 to 3 mm.

15. A foldable portable electronic device comprising:
   a housing having first and second portions coupled for rotational motion at a bend axis, wherein the first portion of the housing is configured to fold over the second portion of the housing;
   a display cover layer;

an array of pixels configured to display an image through the display cover layer;

a metal layer coupled to the array of pixels; and a spring layer having an array of metal springs between the first portion of the housing and the metal layer and between the second portion of the housing and the metal layer.

16. The foldable portable electronic device defined in claim 15 wherein a strip-shaped area of the spring layer that overlaps the bend axis has first springs of a first stiffness and wherein other areas of the spring layer have second springs with a second stiffness that is different than the first stiffness.

17. A foldable electronic device, comprising:

a foldable housing having a first metal layer;

a foldable display having pixels supported by a second metal layer;

an array of metal springs interposed between the first and second metal layers; and a sheet of metal that contains the array of metal springs.

18. The foldable electronic device defined in claim 17 wherein foldable housing has a hinge, wherein the foldable housing is configured to bend about a bend axis that is aligned with the hinge, wherein the array of metal springs overlaps the bend axis, and wherein the array of metal springs is welded to the second metal layer.

19. The foldable electronic device defined in claim 17 wherein the array of metal springs has bases attached to the sheet of metal.

20. The foldable electronic device defined in claim 19 wherein the array of metal springs has tips that extend upwards from the sheet of metal.

21. The foldable portable electronic device defined in claim 15, wherein the array of pixels is within a flexible display panel and wherein the metal layer is separate from and is attached to the flexible display panel.

22. The foldable portable electronic device defined in claim 15, wherein the array of pixels is within a flexible display panel and wherein the metal layer is a layer of the flexible display panel.

\* \* \* \* \*